(12) United States Patent
Liu et al.

(10) Patent No.: US 12,062,690 B2
(45) Date of Patent: Aug. 13, 2024

(54) CAPACITOR ARRAY STRUCTURE AND METHOD FOR FORMING SAME

(71) Applicant: CHANGXIN MEMORY TECHNOLOGIES, INC., Hefei (CN)

(72) Inventors: Yanghao Liu, Hefei (CN); Jun Xia, Hefei (CN); Kangshu Zhan, Hefei (CN); Sen Li, Hefei (CN); Qiang Wan, Hefei (CN); Tao Liu, Hefei (CN); Penghui Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 382 days.

(21) Appl. No.: 17/522,290

(22) Filed: Nov. 9, 2021

(65) Prior Publication Data
US 2023/0006033 A1   Jan. 5, 2023

Related U.S. Application Data

(63) Continuation of application No. PCT/CN2021/116895, filed on Sep. 7, 2021.

(30) Foreign Application Priority Data

Jul. 5, 2021 (CN) .......................... 202110759810.5

(51) Int. Cl.
*H10B 12/00* (2023.01)
*H01L 49/02* (2006.01)

(52) U.S. Cl.
CPC .............. *H01L 28/92* (2013.01); *H01L 28/91* (2013.01); *H10B 12/03* (2023.02); *H10B 12/033* (2023.02)

(58) Field of Classification Search
CPC ......... H01L 28/90; H01L 28/91; H01L 28/92; H10B 12/03; H10B 12/033
See application file for complete search history.

(56) References Cited

U.S. PATENT DOCUMENTS 6,509,244 B2   1/2003   Kim
7,364,967 B2   4/2008   Kim
(Continued)

FOREIGN PATENT DOCUMENTS

CN     1790675 A    6/2006
CN   101097852 A    1/2008
(Continued)

*Primary Examiner* — Robert G Bachner
*Assistant Examiner* — Molly K Reida
(74) *Attorney, Agent, or Firm* — Kilpatrick Townsend & Stockton LLP (57) ABSTRACT

A method for forming a capacitor array structure includes the following operations. A base is formed, which includes a substrate, a stack structure located on the substrate and a mask layer located on the stack structure in which an etching window that penetrates the mask layer in a direction perpendicular to the substrate is provided. The stack structure is etched along the etching window to form a capacitor hole that penetrates the stack structure along the direction perpendicular to the substrate. A conductive layer that fills up the capacitor hole and the etching window and covers a top surface of the mask layer is formed. The conductive layer and the mask layer at a top surface of the stack structure are removed, and the conductive layer remaining in the capacitor hole forms a lower electrode.

17 Claims, 10 Drawing Sheets

(56) References Cited

U.S. PATENT DOCUMENTS

| | | |
|---|---|---|
| 7,670,903 B2 | 3/2010 | Park |
| 7,985,645 B2 | 7/2011 | Park |
| 8,148,764 B2 | 4/2012 | Park |
| 2002/0102807 A1 | 8/2002 | Kim |
| 2006/0099760 A1 | 5/2006 | Kim |
| 2008/0003741 A1 | 1/2008 | Park |
| 2008/0185624 A1 | 8/2008 | Kim |
| 2010/0327410 A1 | 12/2010 | Park |
| 2011/0272784 A1 | 11/2011 | Park |
| 2014/0065785 A1* | 3/2014 | Yoon ........................ H01L 28/91 |
| | | 438/381 |
| 2022/0005829 A1* | 1/2022 | Hu ........................ H10B 53/20 |

FOREIGN PATENT DOCUMENTS

| | | |
|---|---|---|
| CN | 101937837 A | 1/2011 |
| CN | 107634047 A | 1/2018 |
| CN | 111584358 A | 8/2020 |
| CN | 112951768 A | 6/2021 |

* cited by examiner

CAPACITOR ARRAY STRUCTURE AND METHOD FOR FORMING SAME

CROSS-REFERENCE TO RELATED APPLICATIONS

The present application is a continuation application of International Application No. PCT/CN2021/116895, filed on Sep. 7, 2021, which claims priority to Chinese Patent Application No. 202110759810.5, filed on Jul. 5, 2021. The disclosures of International Application No. PCT/CN2021/116895 and Chinese Patent Application No. 202110759810.5 are hereby incorporated by reference in their entireties.

BACKGROUND

A Dynamic Random Access Memory (DRAM) is a commonly used semiconductor structure in electronic devices such as computers, and is composed of a plurality of storage units. Each of the storage units typically includes a transistor and a capacitor. The transistor has a gate electrically connected to a word line, a source electrically connected to a bit line, and a drain electrically connected to the capacitor. A word line voltage on the word line can control on and off of the transistor, thus through the bit line, data information stored in the capacitor can be read or data information can be written into the capacitor.

Due to limitations of the process method, feature sizes of capacitor holes in the formed capacitor array structure increase abnormally, thereby affecting the electrical property of the capacitor.

Therefore, how to avoid the abnormal increase of the capacitor holes so as to improve the electrical property of the capacitor array structure is a technical problem that needs to be solved urgently at present.

SUMMARY

The disclosure relates to the technical field of integrated circuit, in particular to a capacitor array structure and a method for forming the same.

According to some embodiments, the disclosure provides a method for forming a capacitor array structure, which includes the following operations.

A base is formed. The base includes a substrate, a stack structure located on the substrate and a mask layer located on the stack structure, in which an etching window that penetrates the mask layer in a direction perpendicular to the substrate is provided in the mask layer.

The stack structure is etched along the etching window to form a capacitor hole that penetrates the stack structure along the direction perpendicular to the substrate.

A conductive layer that fills up the capacitor hole and the etching window and covers a top surface of the mask layer is formed.

The conductive layer and the mask layer at a top surface of the stack structure are removed, in which the conductive layer remaining in the capacitor hole forms a lower electrode.

According to some other embodiments, the disclosure further provides a capacitor array structure, which is formed by using the above method for forming a capacitor array structure.

DETAILED DESCRIPTION

Specific embodiments of a capacitor array structure and a method for forming the same provided by the disclosure will be described in combination with the drawings.

Figure 1:
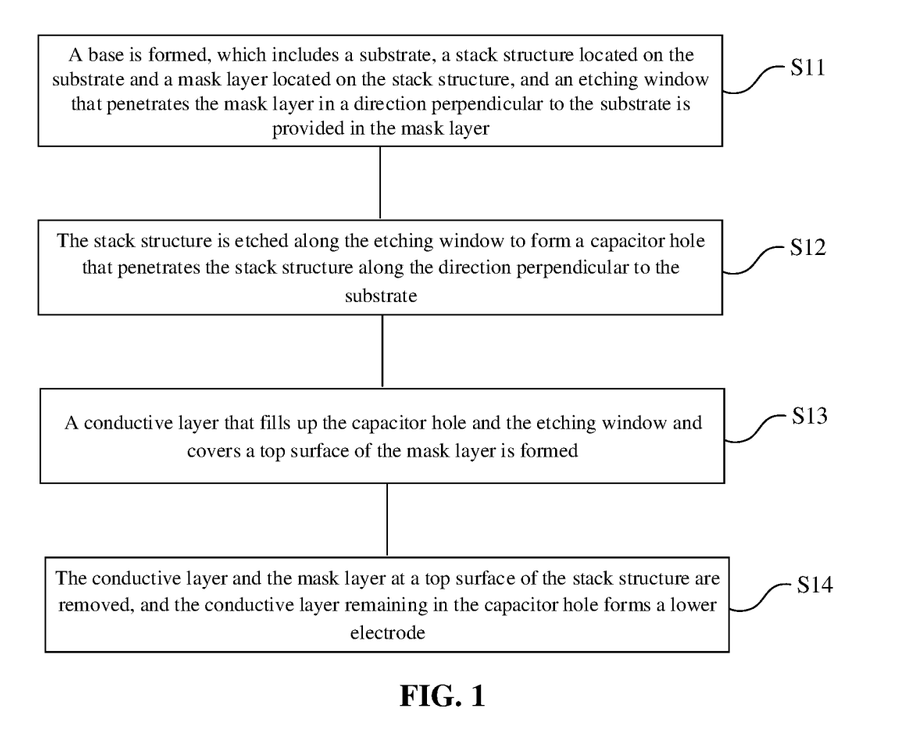
FIG. 1 is a flow chart of a method for forming a capacitor array structure in specific embodiments of the disclosure.

The specific embodiment provides a method for forming a capacitor array structure. FIG. 1 is a flow chart of a method for forming a capacitor array structure in specific embodiments of the disclosure, FIG. 2A to FIG. 2G are schematic sectional views illustrating main processes in forming a capacitor array structure in specific embodiments of the disclosure. As shown in FIG. 1, FIG. 2A to FIG. 2H, the method for forming a capacitor array structure provided by the specific embodiment includes the following operations.

Figure 2A:
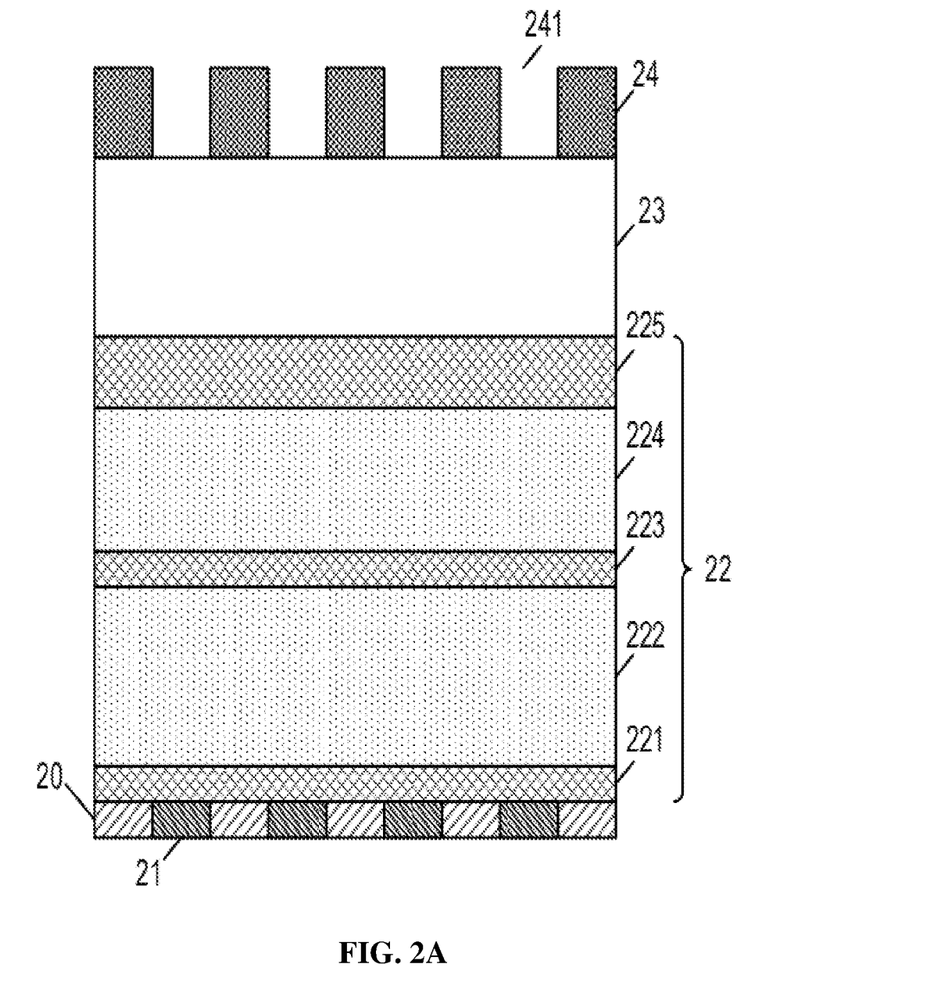
FIG. 2A to FIG. 2H are schematic sectional views illustrating main processes in forming a capacitor array structure in specific embodiments of the disclosure.
Figure 2B:
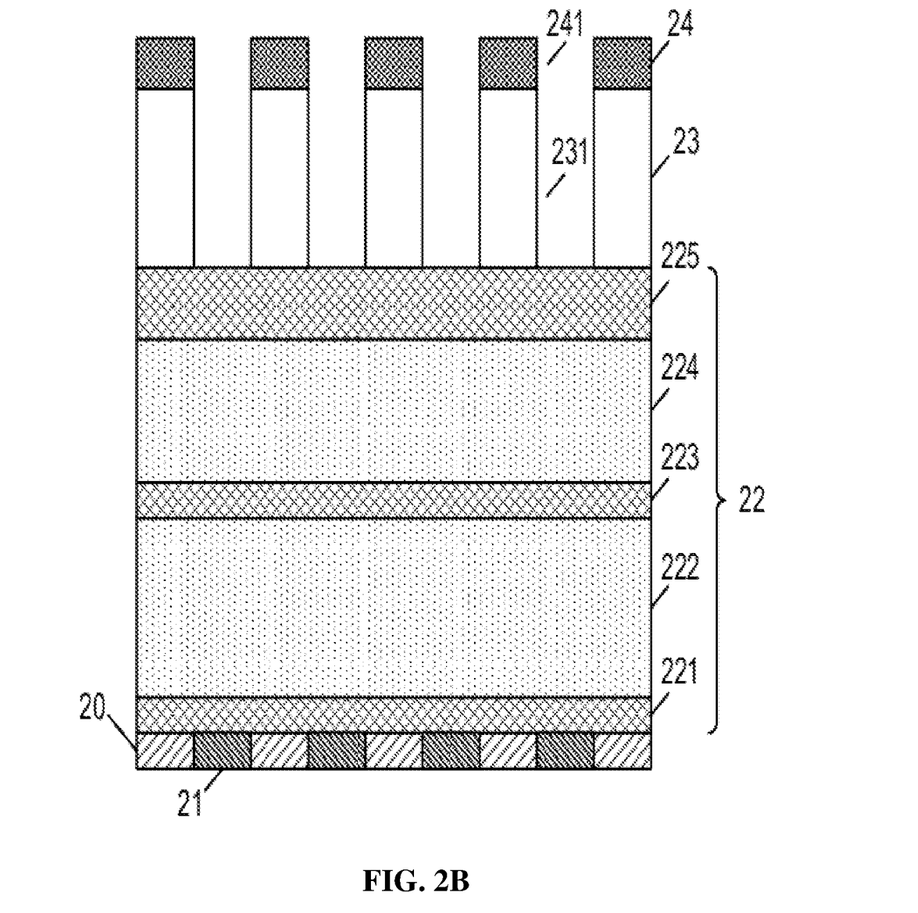

At S11, a base is formed, which includes a substrate 20, a stack structure 22 located on the substrate 20 and a mask layer 23 located on the stack structure 22, and an etching window 231 that penetrates the mask layer 23 in a direction perpendicular to the substrate 20 is provided in the mask layer 23, as shown in FIG. 2B.

In some embodiments, forming the base particularly includes the following operations.

A substrate 20 is provided.

Support layers and sacrificial layers are alternately deposited on a surface of the substrate 20 to form the stack structure 22.

The mask layer 23 is formed on a surface of the stack structure 22.

The mask layer 23 is patterned, so that the etching window 231 that penetrates the mask layer 23 in a direction perpendicular to the substrate 20 is formed in the mask layer 23.

Specifically, the substrate 20 may be, but is not limited to, a silicon substrate, the specific embodiment takes a case where the substrate 20 is the silicon substrate as an example for description. In another example, the substrate 20 may be a semiconductor substrate, such as gallium nitride, gallium arsenide, gallium carbide, silicon carbide, or semiconductor-on-insulator (SOD, or the like. There are a plurality of capacitor contacts 21 arranged in an array in the substrate 20. A material of the capacitor contacts 21 may be a conductive metal material, such as metal tungsten.

In some embodiments, forming the stack structure 22 particularly includes the following operations.

A bottom support layer 221 is deposited on the surface of the substrate 20.

A first sacrificial layer 222 is deposited on a surface of the bottom support layer 221.

An intermediate support layer 223 is deposited on a surface of the first sacrificial layer 222.

A second sacrificial layer 224 is deposited on a surface of the intermediate support layer 223.

A top support layer 225 is deposited at on surface of the second sacrificial layer 224.

Specifically, a chemical vapor deposition (CVD) process, a physical vapor deposition (PVD) process, or an atomic layer deposition (ALD) process may be used to sequentially deposit, along the direction perpendicular to the surface of the substrate 20, the bottom support layer 221, the first sacrificial layer 222, the intermediate support layer 223, the second sacrificial layer 224, and the top support layer 225 on the surface of the substrate 20 to form the stack structure 22. The above is merely illustrative, and those skilled in the art may select the specific number of the support layers and the sacrificial layers that needs to be deposited according to the actual needs, such as depending on factors, for example, the height of the capacitor required.

In some embodiments, a material of the support layers includes a nitride material, and a material of the sacrificial layers includes an oxide material.

For example, all of the bottom support layer 221, the intermediate support layer 223, and the top support layer 225 have the same material, which, for example, is silicon nitride; both the first sacrificial layer 222 and the second sacrificial layer 224 also have the same material, which, for example, is silica.

After the stack structure 22 is formed, the mask layer 23 is deposited at a top surface of the stack structure 22 (that is, a surface, facing away from the substrate, of the stack structure 22). A material of the mask layer 23 may be a hard mask material, such as polysilicon, and may also be an organic mask material, such as carbon. Afterwards, a patterned photoresist layer 24 is formed on the surface of the mask layer 23, there is an opening 241 that exposes the mask layer 23 in the photoresist layer 24, as shown in FIG. 2A. Next, a dry etching process may be used to etch the mask layer 23 along the opening 241 to form an etching window 231 that exposes the stack structure in the mask layer 23 (that is, the etching window 231 penetrates the mask layer 23 along the direction perpendicular to the surface of the substrate 20), as shown in FIG. 2B.

Figure 2C:
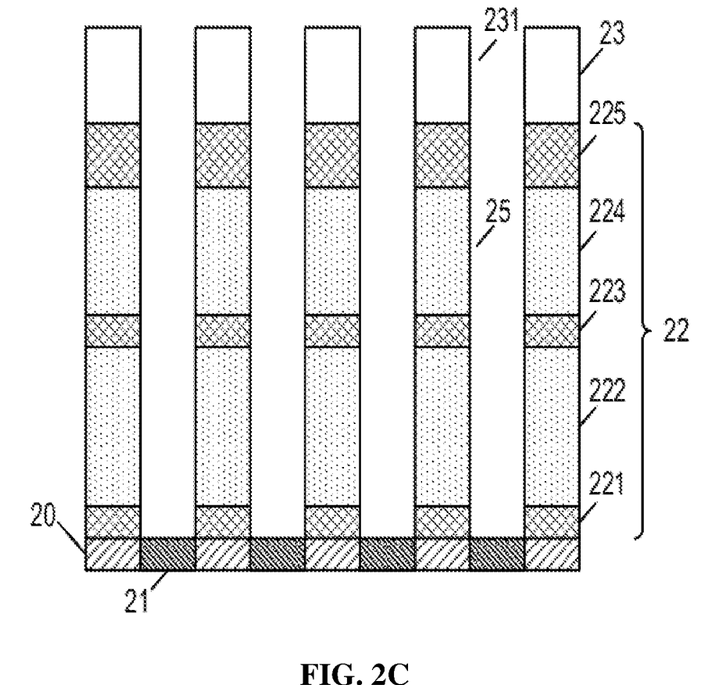

At S12, the stack structure 22 is etched along the etching window 231 to form a capacitor hole 25 that penetrates the stack structure 22 along the direction perpendicular to the substrate 20, as shown in FIG. 2C.

In some embodiments, etching the stack structure 22 along the etching window 231 particularly includes the following operations.

A first dry etching process is used to etch the stack structure 22 along the etching window 231.

Specifically, the first dry etching process may be used to etch the stack structure 22 down vertically along the etching window 231 to form the capacitor hole 25 that penetrates the stack structure 22 along the direction perpendicular to the substrate 20 and exposes the capacitor contact 21 in the substrate 20. After the photoresist layer 24 is removed, a structure shown in FIG. 2C is obtained.

Figure 2D:
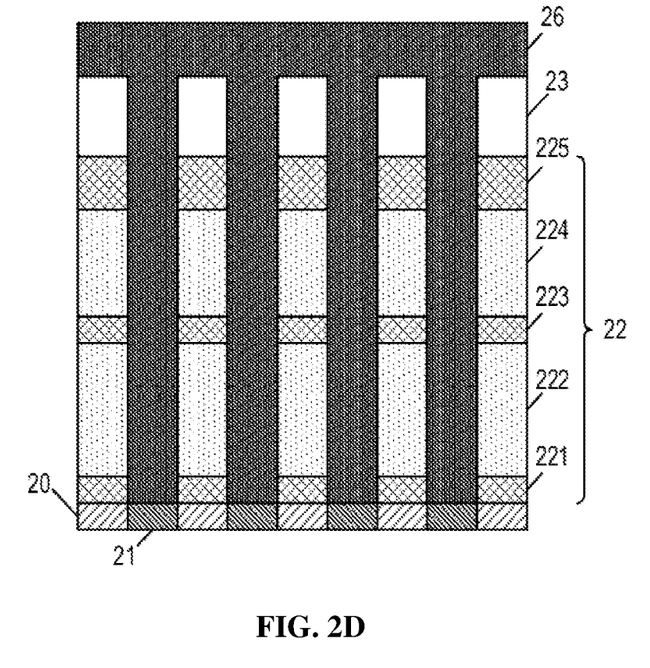

At S13, a conductive layer 26 that fills up the capacitor hole 25 and the etching window 231 and covers the top surface of the mask layer 23 is formed, as shown in FIG. 2D.

Specifically, after the capacitor hole 25 is formed, in order to sufficiently fill up the capacitor hole 25 and avoid generating voids, the ALD process may be used to deposit a conductive material so as to form the conductive layer 26 that fills up the capacitor hole 25 and the etching window 231 and covers the top surface of the mask layer 23. A material of the conductive layer 26 may be, but is not limited to, TiN.

In the embodiment, after the capacitor hole 25 is formed, firstly the capacitor hole 25 is filled up instead of removing the mask layer 23, so as to avoid subsequent processes, such as the process of removing the mask layer 23 resulting in an abnormal increase in the feature size of the capacitor hole 25.

Figure 2E:
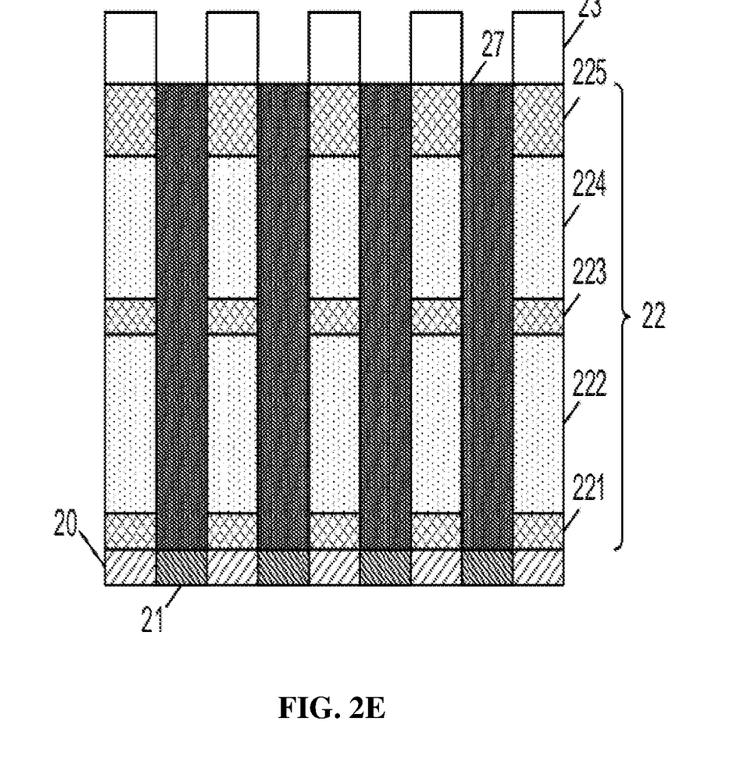
Figure 2F:
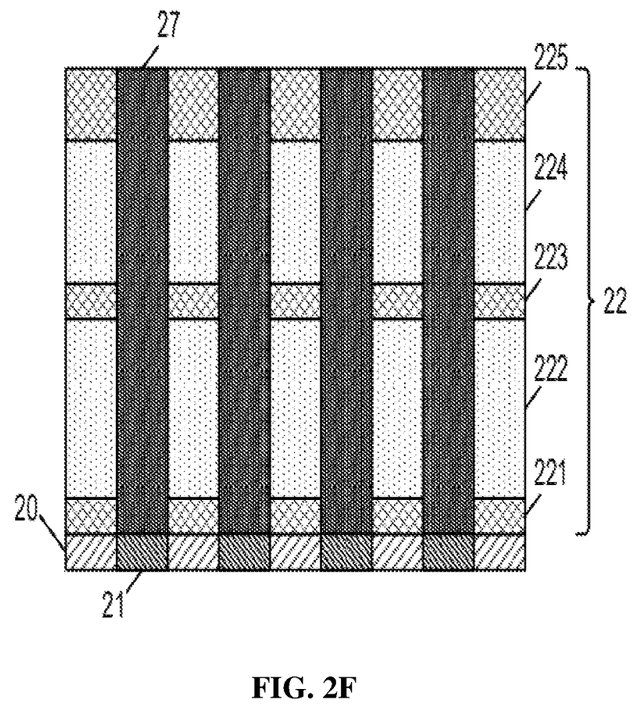

At S14, the conductive layer 26 and the mask layer 23 at the top surface of the stack structure 22 are removed, the conductive layer 26 remaining within the capacitor hole 25 forms a lower electrode 27, as shown in FIG. 2F.

In some embodiments, removing the conductive layer 26 and the mask layer 23 at the top surface of the stack structure 22 particularly includes the following operations.

The conductive layer 26 that covers the top surface of the mask layer 23 and is located in the etching window 231 is removed and the mask layer 23 is exposed, as shown in FIG. 2E.

The mask layer 23 is then removed.

In order to avoid an influence on the conductive layer 26 filled within the capacitor hole 25 in the process of removing the mask layer 23, the specific embodiment employs a stepwise removal, in which the conductive layer 26 that covers the top surface of the mask layer 23 and is located in the etching window 231 is removed firstly, and then the mask layer 23 is removed.

In some embodiments, removing the conductive layer 26 that covers the top surface of the mask layer 23 and is located in the etching window 231 particularly includes the following operation.

A second dry etching process is used to remove the conductive layer 26 that covers the top surface of the mask layer 23 and is located in the etching window 231.

In some embodiments, removing the conductive layer 26 that covers the top surface of the mask layer 23 and is located in the etching window 231 particularly includes the following operation.

A second dry etching process is used to remove the conductive layer 26 that covers the top surface of the mask layer 23 and is located in the etching window 231 as well as a portion of the mask layer 23.

In some embodiments, the method for forming a semiconductor structure includes the following operation.

An etching parameter of the second dry etching process is controlled so that the top surface of the remaining conductive layer 26 is flush with the top surface of the stack structure 22.

In some embodiments, the etching parameter includes an etching time.

Specifically, a second dry etchant used in the second dry etching process may be selected such that an etching rate of the second dry etchant on the conductive layer 26 is greater than an etching rate of the second dry etchant on the mask layer 23, and by predetermining the specific value of the etch rate of the second dry etchant on the conductive layer 26 and the specific value of the etch rate of the second dry etchant on the mask layer 23, it is possible to precisely control the amount of the etched conductive layer 26 by controlling the etching time in the course of etching, and thus the top surface of the remaining conductive layer 26 is flush with the top surface of the stack structure 22, thereby avoiding a damage to the conductive layer 26 inside the capacitor hole 25 and ensuring the morphology integrity of the subsequently formed lower electrode 27.

Those skilled in the art may further make the top surface of the remaining conductive layer 26 flush with the top surface of the stack structure 22 by controlling other etching parameters, such as selecting a second dry etchant and/or adjusting the flow rate of the second dry etchant, which is not limited in this specific embodiment.

In some embodiments, an etching selection ratio of the second dry etchant used in the second dry etching process between the conductive layer 26 and the mask layer 23 is greater than 2, for example, may be 3, 5, 8, 10, or 20.

In some embodiments, the material of the conductive layer 26 includes TiN, the material of the mask layer 23 includes polysilicon.

In some embodiments, the second dry etchant used in the second dry etching process includes a mixed gas of $Cl_2$ and $BCl_3$.

Specifically, when the material of the conductive layer 26 includes TiN and the material of the mask layer 23 includes polysilicon, the mixed gas of $Cl_2$ and $BCl_3$ is selected as the second dry etchant, which can effectively improve the etching selection ratio between the conductive layer 26 and the mask layer 23, therefore it is possible to sufficiently remove the conductive layer 26 on the top surface of the mask layer 23 and in the etching window 231.

In some embodiments, removing the mask layer 23 particularly includes the following operation.

A third dry etching process is used to remove the mask layer 23.

In some embodiments, the etching selection ratio of a third dry etchant used in the third dry etching process between the mask layer 23 and the conductive layer 26 is greater than 10, for example, may be 15, 20, 30, 50, or 100.

In some embodiments, the etching selection ratio of the third dry etchant between the mask layer 23 and the conductive layer 26 is greater than the etching selection ratio of the second dry etchant between the conductive layer 26 and the mask layer 23.

In some embodiments, the third dry etchant used in the third dry etching process includes a mixed gas of HBr and $Cl_2$.

Specifically, in order to avoid the damage to the lower electrode 27 in the process of removing the remaining mask layer 23, it is necessary to control that the etching selection ratio of the third dry etchant between the mask layer 23 and the conductive layer 26 is greater than the etching selection ratio of the second dry etchant between the conductive layer 26 and the mask layer 23. For example, when the material of the conductive layer 26 includes TiN and the material of the mask layer 23 includes polysilicon, and the mixed gas containing HBr and $Cl_2$ is selected as the third dry etchant, there is no damage to the lower electrode 27 within the capacitor hole 25 while the mask layer 23 is sufficiently removed.

In some embodiments, after the mask layer 23 is removed, the method further includes the following operation.

The top surface of the stack structure 22 and the top surface of the lower electrode 27 are cleaned.

Specifically, in order to avoid the influence of the polymer generated in the process of etching the mask layer 23 or the residual third dry etchant on subsequent processes, such as the influence on subsequent deposition of a dielectric layer and an upper electrode, after the mask layer 23 is etched away, deionized water may be used to clean the top surface of the stack structure 22 and the top surface of the lower electrode 27 to remove residual impurities.

Figure 2G:
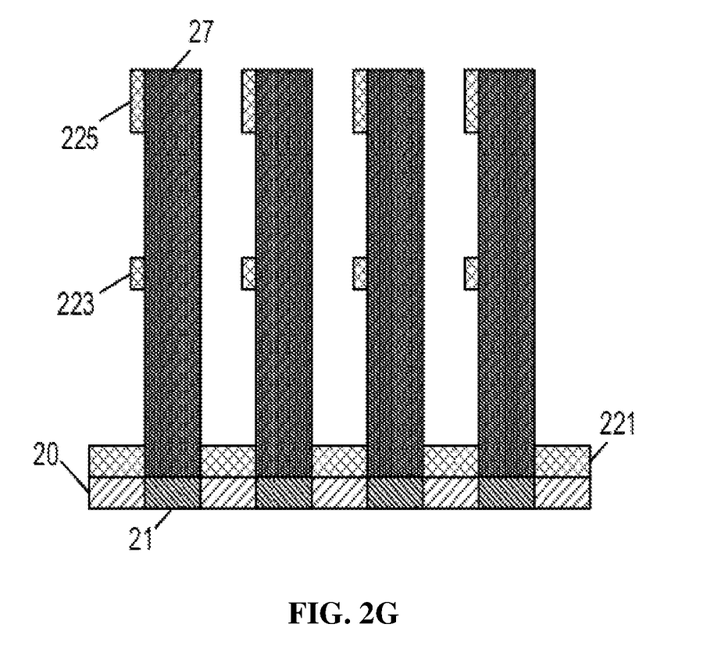
Figure 2H:
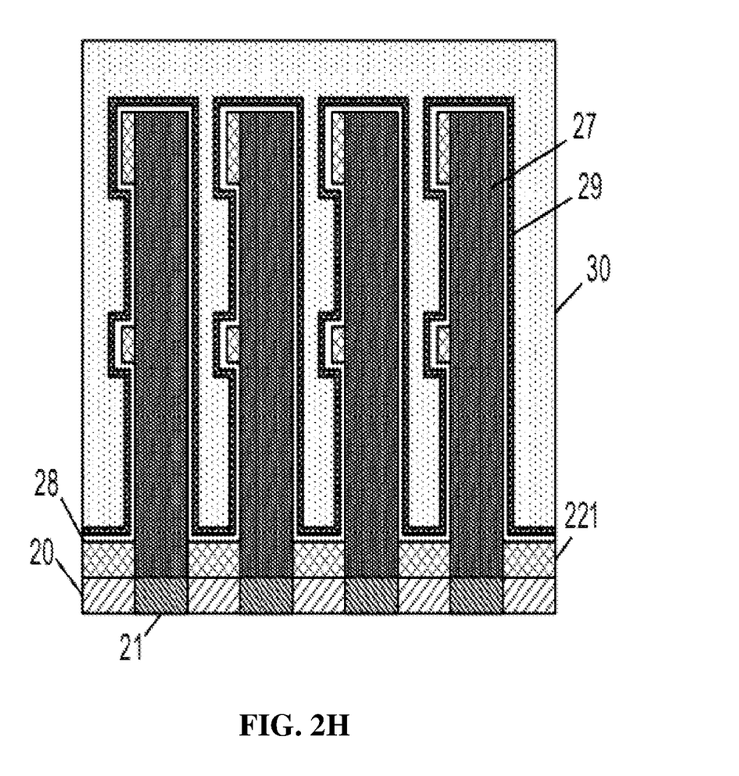

Afterwards, the dry etching process may be used to remove a portion of the top support layer 225 to expose the second sacrificial layer 224; then a wet etch process is used to remove all of the second sacrificial layer 224; next, a portion of the intermediate support layer 223 is etched to expose the first sacrificial layer 222; after all of the first sacrificial layer 222 is removed with the wet etch process, a structure as shown in FIG. 2G is obtained. Next, a dielectric layer 28 is deposited on the surface of the lower electrode 27, the surface of the remaining top support layer 225, the surface of the remaining intermediate support layer 223, and the surface of the bottom support layer 221, and an upper electrode 29 is deposited on the surface of the dielectric layer 28. Then, a conductive filling layer 30, that covers the surface of the upper electrode 29 and fills up recesses in the upper electrode 29, is formed to form a pillar-shaped capacitor as shown in FIG. 2H. A material of the dielectric layer 28 may be an oxide material having a high dielectric constant. A material of the upper electrode 29 may be the same as the material of the lower electrode 27, for example, both are TiN. A material of the conductive filling layer 30 may be polysilicon.

Figure 3:
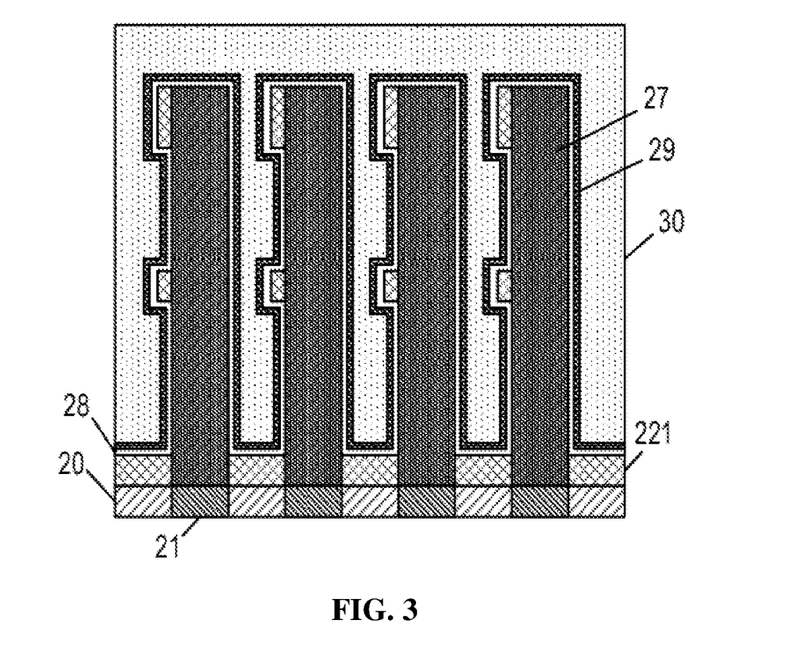
FIG. 3 is a schematic diagram of a capacitor array structure in specific embodiments of the disclosure.

Moreover, the specific embodiment further provides a capacitor array structure, which is formed by using the method for forming a capacitor array structure as mentioned in any of the above embodiments. FIG. 3 is a schematic diagram of a capacitor array structure in specific embodiments of the disclosure.

As for the capacitor array structure and the method for forming the same provided in the specific embodiment, the mask layer is removed after the conductive layer that fills up the capacitor hole and covers the top surface of the mask layer is formed, so that an abnormal enlarge in the feature size of the capacitor hole in the process of removing the mask layer is avoided, thereby ensuring the feature size of the formed lower electrode and improving the electrical property of the capacitor array structure.

The above are only the preferred embodiments of this application. It should be pointed out that for those of ordinary skill in the art, several improvements and modifications may further be made without departing from the principle of this disclosure, and these improvements and modifications may also be considered as falling in the scope of protection of this disclosure.

The invention claimed is:

1. A method for forming a capacitor array structure, comprising:
    forming a base, the base comprising a substrate, a stack structure located on the substrate and a mask layer located on the stack structure, in which an etching window that penetrates the mask layer in a direction perpendicular to the substrate is provided in the mask layer;
    etching the stack structure along the etching window to form a capacitor hole that penetrates the stack structure along the direction perpendicular to the substrate;
    forming a conductive layer that fills up the capacitor hole and the etching window and covers a top surface of the mask layer;
    removing the conductive layer that covers the top surface of the mask layer and is located in the etching window with a first dry etching process to expose the mask layer; and
    removing the mask layer, the conductive layer remaining in the capacitor hole forming a lower electrode;
    wherein a top surface of the conductive layer remaining in the capacitor hole is flush with a top surface of the stack structure by controlling an etching parameter of the first dry etching process.

2. The method for forming a capacitor array structure of claim 1, wherein forming the base comprises:
    providing the substrate;
    alternately depositing support layers and sacrificial layers on a surface of the substrate to form the stack structure;
    forming the mask layer at a surface of the stack structure; and
    patterning the mask layer to form the etching window in the mask layer, the etching window penetrating the mask layer along the direction perpendicular to the substrate.

3. The method for forming a capacitor array structure of claim 2, wherein forming the stack structure comprises:

depositing a bottom support layer of the support layers on the surface of the substrate;

depositing a first sacrificial layer of the sacrificial layers on a surface of the bottom support layer;

depositing an intermediate support layer of the support layers on a surface of the first sacrificial layer;

depositing a second sacrificial layer of the sacrificial layers on a surface of the intermediate support layer; and depositing a top support layer of the support layers on a surface of the second sacrificial layer.

4. The method for forming a capacitor array structure of claim 2, wherein a material of the support layers comprises a nitride material, and a material of the sacrificial layers comprises an oxide material.

5. The method for forming a capacitor array structure of claim 1, wherein etching the stack structure along the etching window comprises:

etching the stack structure along the etching window with a second-first dry etching process.

6. The method for forming a capacitor array structure of claim 1, wherein the etching parameter comprises an etching time.

7. The method for forming a capacitor array structure of claim 1, wherein an etching selection ratio of a first dry etchant used in the first dry etching process between the conductive layer and the mask layer is greater than 2.

8. The method for forming a capacitor array structure of claim 1, wherein a material of the conductive layer comprises TiN, and a material of the mask layer comprise polysilicon.

9. The method for forming a capacitor array structure of claim 1, wherein a first dry etchant used in the first dry etching process comprises a mixed gas of $Cl_2$ and $BCl_3$.

10. The method for forming a capacitor array structure of claim 9, wherein removing the mask layer comprises:

removing the mask layer with a third dry etching process.

11. The method for forming a capacitor array structure of claim 10, wherein an etching selection ratio of a second dry etchant used in the third dry etching process between the mask layer and the conductive layer is greater than 10.

12. The method for forming a capacitor array structure of claim 11, wherein the etching selection ratio of the second dry etchant between the mask layer and the conductive layer is greater than an etching selection ratio of the first dry etchant between the conductive layer and the mask layer.

13. The method for forming a capacitor array structure of claim 11, wherein the second dry etchant used in the third dry etching process comprises a mixed gas of HBr and $Cl_2$.

14. The method for forming a capacitor array structure of claim 1, further comprising:

cleaning the top surface of the stack structure and a top surface of the lower electrode after removing the mask layer.

15. The method for forming a capacitor array structure of claim 1, wherein a portion of the mask layer is removed with the first dry etching process.

16. A method for forming a capacitor array structure, comprising:

forming a base, the base comprising a substrate, a stack structure located on the substrate and a mask layer located on the stack structure, in which an etching window that penetrates the mask layer in a direction perpendicular to the substrate is provided in the mask layer;

etching the stack structure along the etching window to form a capacitor hole that penetrates the stack structure along the direction perpendicular to the substrate;

forming a conductive layer that fills up the capacitor hole and the etching window and covers a top surface of the mask layer;

removing the conductive layer that covers the top surface of the mask layer and is located in the etching window with a dry etching process to expose the mask layer; and removing the mask layer, the conductive layer remaining in the capacitor hole forming a lower electrode;

wherein an etching selection ratio of a dry etchant used in the dry etching process between the conductive layer and the mask layer is greater than 2.

17. A method for forming a capacitor array structure, comprising:

forming a base, the base comprising a substrate, a stack structure located on the substrate and a mask layer located on the stack structure, in which an etching window that penetrates the mask layer in a direction perpendicular to the substrate is provided in the mask layer;

etching the stack structure along the etching window to form a capacitor hole that penetrates the stack structure along the direction perpendicular to the substrate;

forming a conductive layer that fills up the capacitor hole and the etching window and covers a top surface of the mask layer;

removing the conductive layer that covers the top surface of the mask layer and is located in the etching window with a first dry etching process to expose the mask layer; and removing the mask layer with a second dry etching process, the conductive layer remaining in the capacitor hole forming a lower electrode.

* * * * *